United States Patent [19]

Ovshinsky

[11] 3,983,542

[45] Sept. 28, 1976

[54] METHOD AND APPARATUS FOR RECORDING INFORMATION

[75] Inventor: Stanford R. Ovshinsky, Bloomfield Hills, Mich.

[73] Assignee: Energy Conversion Devices, Inc., Troy, Mich.

[22] Filed: Feb. 3, 1975

[21] Appl. No.: 546,299

Related U.S. Application Data

[60] Division of Ser. No. 161,219, July 9, 1971, Pat. No. 3,868,651, which is a continuation-in-part of Ser. No. 63,404, Aug. 13, 1970, abandoned.

[52] U.S. Cl. .............................. 340/173 R; 357/2; 346/1
[51] Int. Cl.$^2$ .................. G11C 13/00; G11C 11/34
[58] Field of Search.... 357/2; 340/173 LM, 173 LS; 346/1

[56] References Cited
UNITED STATES PATENTS
3,629,155 12/1971 Kristensen .............................. 357/2

OTHER PUBLICATIONS
Nature, "Photographyon Selenium," by Selenyi, Apr. 3, 1948.
Rectifying Semi Conductor Contacts by Henisch, Oxford at the Clarendon Press, 1957, pp. 75–79.
Inorganic Polymer Chemistry by Gimblett, London Butterworths, 1963, pp. 234–236.

Primary Examiner—Terrell W. Fears
Attorney, Agent, or Firm—Wallenstein, Spangenberg, Hattis & Strampel

[57] ABSTRACT

The method and apparatus for recording information includes a layer of memory material which normally has one structural condition having one detectable characteristic, which is capable of having portions thereof physically changed to another structural condition having another detectable characteristic, which has internal biasing forces toward said other structural condition, and which has internal inhibitions against the action of said biasing forces. The layer of memory material is provided with a catalytic material which is catalytically capable of relatively increasing said biasing forces and decreasing said inhibitions against the action of said biasing forces of the memory material. At desired portions of the layer of memory material in accordance with a desired pattern of useful information, energy is applied to the layer for activating the catalytic material at said desired portions of the layer and physically changing the layer at said desired portions from said one detectable structural condition to said other detectable structural condition to record the desired pattern of useful information in the layer.

54 Claims, 21 Drawing Figures

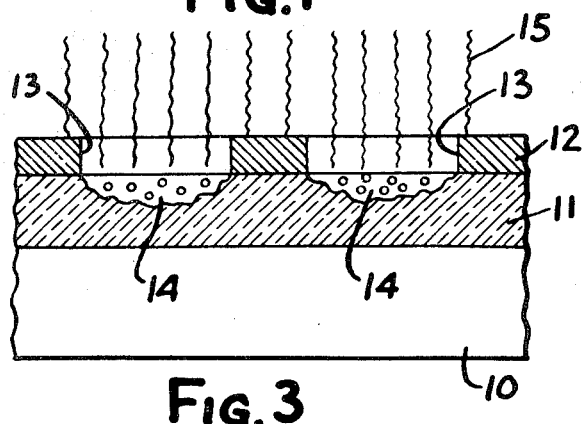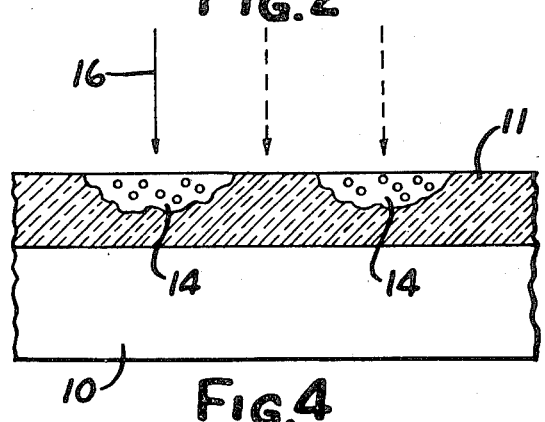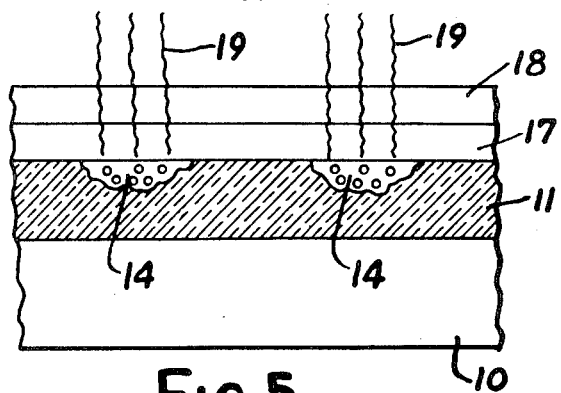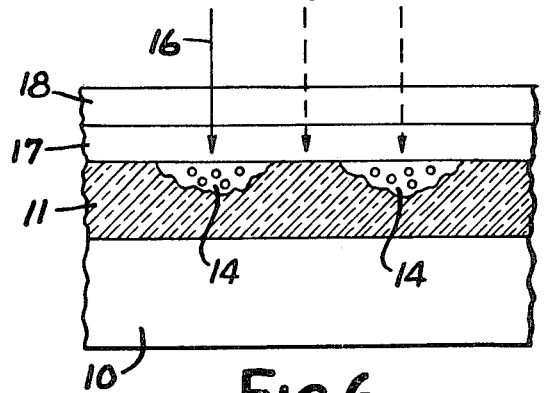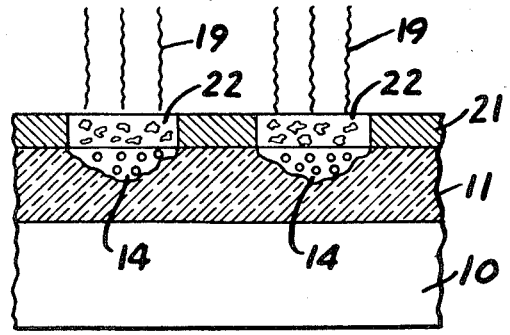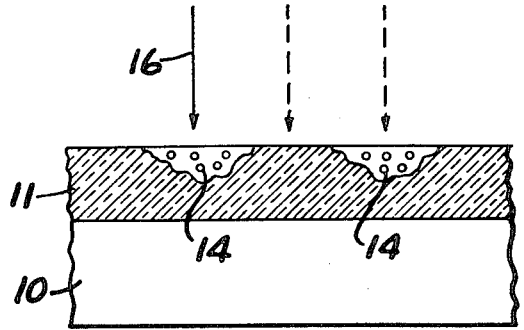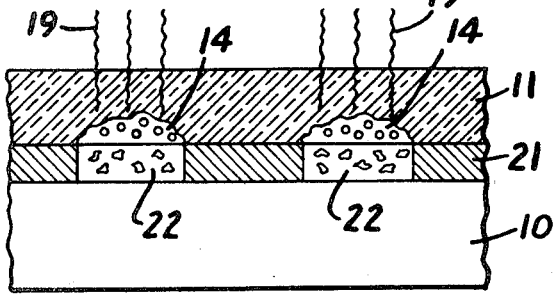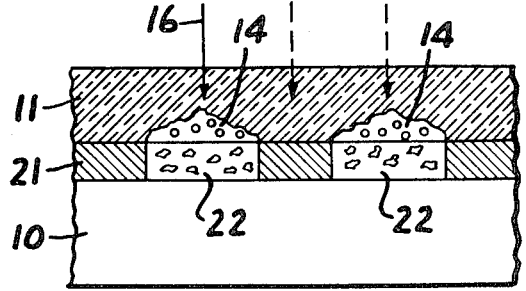

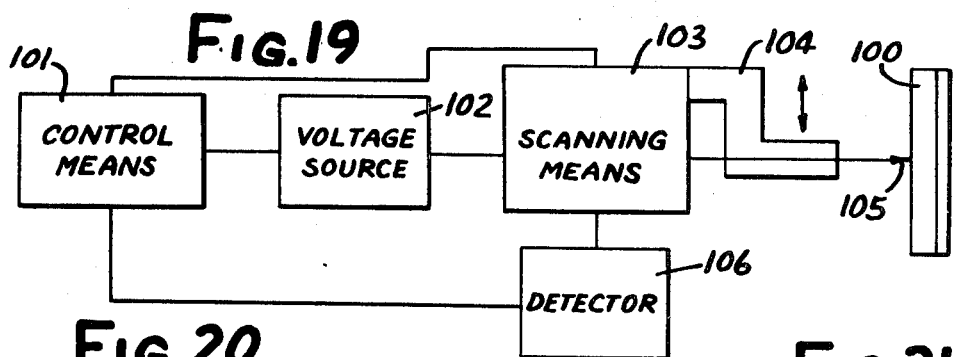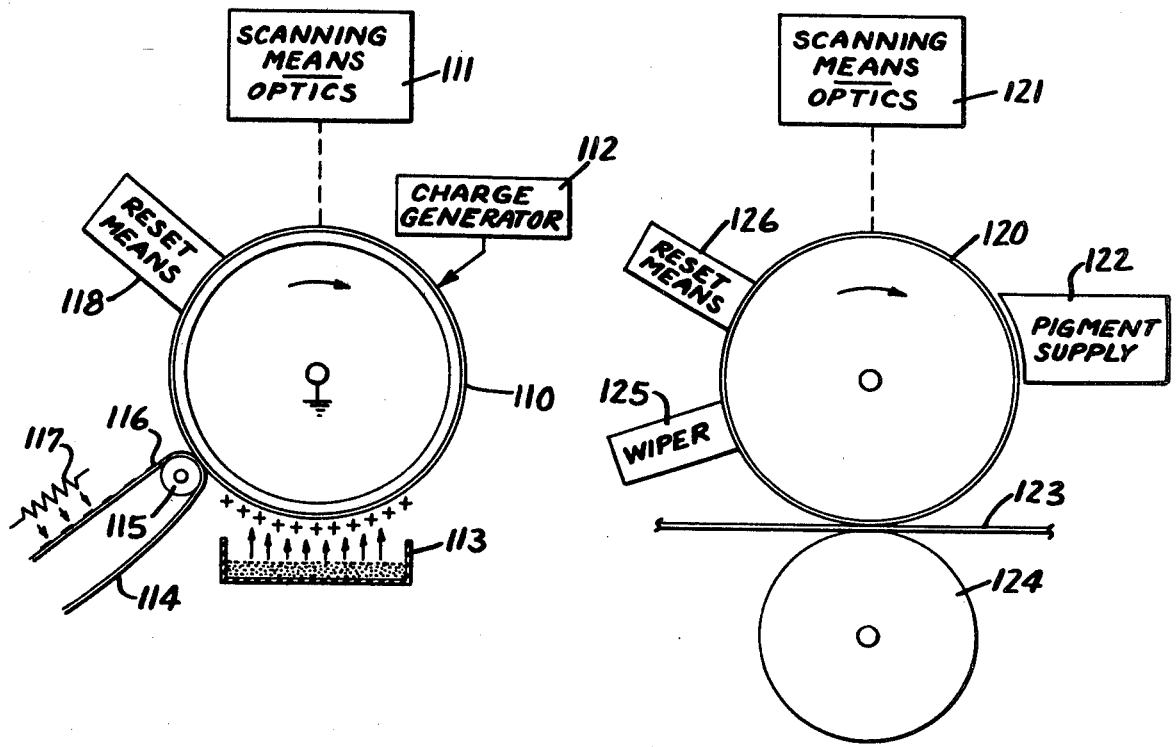

METHOD AND APPARATUS FOR RECORDING INFORMATION

This application is a division of copending U.S. application ser. No. 161,219, filed July 9, 1971 now U.S. Pat. No. 3,868,651 issued Feb. 25, 1975, which is a continuation-in-part of then copending U.S. application Ser. No. 63,404, filed Aug. 13, 1970, now abandoned.

In my copending application Ser. No. 791,441, filed January 15, 1969 and issued as U.S. Pat. No. 3,530,441 on Sept. 22, 1970 (as a continuation-in-part of application Ser. No. 754,607, filed Aug. 22, 1968 and now abandoned) and directed to a method and apparatus for storing and retrieving information and, also, in my prior U.S. Pat. No. 3,271,591, issued Sept. 6, 1966 and directed to a symmetrical current controlling device, there are disclosed a layer of memory material which normally has one structural condition having one detectable characteristic, and which is capable of having portions thereof physically changed or altered to another structural condition having another detectable condition. Energy is applied to the layer of memory material to physically change or alter the layer at said portions from said one structural condition to said other structural condition, said structurally altered portions remaining in said other structural condition until physically realtered to substantially said one structural condition by the subsequent application of a reset or erase energy pulse. In the aforementioned U.S. Pat. Nos. 3,271,591 and 3,530,441 the energy may be electrical energy and additionally in the aforementioned U.S. Pat. No. 3,530,411 the energy may be beam energy, electromagnetic energy or the like for providing the physical change in structure. The arrangements of the aforementioned U.S. patents produce exceptional results and rapid structural change.

One of the principal objects of this invention is to provide a method and apparatus for recording information which are such as to produce physical change between said one structural condition and said other structural condition by the use of lesser amounts of the applied energy, by the conjoint use of different kinds of applied energy, and to provide such physical change in structure in a more rapid manner.

Briefly, in accordance with this aspect of the invention, there is utilized a layer of memory material, such as, for example those disclosed in the aforementioned U.S. patents, and which is capable of having selected portions thereof undergo a physical change in structure between at least two stable conditions. This material is normally in one of these structural conditions and is capable of being switched to another structural condition in response to the application of energy, such as for example, light, heat, electric field, stress, or the like, or a combination of one or more of the foregoing. These physical changes in structure can be, for example, conformational changes, configurational changes, or positional changes in the organization or arrangement of atoms or molecules in the memory material. Typical conformational, configurational and positional changes include changes from a generally amorphous condition to a more ordered or crystalline like condition which may include different crystalline states, or the reverse; changes from one crystalline form to another crystalline form; changes in the degree of crystallinity; changes in the relative alignment of molecules or segments thereof; changes in intermolecular bonding and the like; folding up, convoluting, packing, stretching out or otherwise changing the shape or geometry of molecules; opening or closing molecular ring structures and other molecular chain scission; attachment of molecular chains; changes in the average length of molecular chains produced for example by coiling or uncoiling; movement of atoms or molecules from one location to another including both correlated and uncorrelated movement or adjacent atoms or molecules; creation or elimination of voids in the memory material, contraction or expansion of the memory material, breaking up or linking up of bonds between atoms or molecules, and combinations of one or more of the foregoing. As an adjunct to these physical changes in structure one or more components of a given memory material may be precipitated out of the material in, for example, a crystalline or amorphous form.

Such physical changes in structure, which can be of a subtle nature, provide drastic changes in detectable characteristics of the memory material. Such changes in detectable characteristics can be readily used in detecting the structure of the selected portions of the memory material for reading out or retrieving information recorded therein by reason of structural change.

When energy is applied to certain types of memory material containing long chain polymers, particularly those with little chemical crosslinking, the atoms or molecules can flow or diffuse exhibiting elastomeric properties. Reduction or termination of the applied energy initiates a decay in such flow or diffusion. The rate of such decay, or quench rate, is important since it is desirable to have the atoms or molecules frozen into their new positions causing a stable physical change in structure to take place prior to substantial return of such memory materials to their original condition before the application of energy. The applied energy can, for example, break bonds between atoms or molecules or reduce Van der Waals forces or other forces between atoms or molecules, or can produce the opposite effect of linking up bonds or increasing such forces. The flow or diffusion of atoms or molecules can also be produced by thermalization processes induced by absorption of the applied energy. Where the broken bonds occur at the end of chains, for example, they render the memory material more chemically active with solvents.

Preferred memory materials are those wherein a large amount of free carriers can be generated therein by the application of energy. For example, where photon energy creates electron hole pairs, it is desirable to have these carriers remain alive and not recombine for a sufficiently long period of time (relaxation time) within which atomic movement can take place. In the memory materials the relaxation or recombination time of the carriers is related to the accompanying movement of the atoms. There is normally a certain density of traps and energy gap in any given memory material which may be changed by the movement of the atoms. This change in trap density and energy gap may extend the time during which such carriers remain alive and atoms reside in a new position causing a non-equilibrium distribution of carriers and a physical change in structure as described above.

The physical changes in structure can be from a disordered amorphous like condition to a more ordered condition, such as, for example, toward a more ordered crystalline like condition. The changes can be substantially within a short range order itself still involving a substantially disordered and generally amorphous condition, or can be from a short range order to a long range order which could provide a crystalline condition.

Preferred memory materials, wherein the physical change in structure is accompanied by a transition between an amorphous condition and a crystalline condition, are capable of existing in either of these two conditions at ambient temperatures in the region or room temperature. At these temperatures an energy barrier exists between these two conditions which may be in the form of mechanical entanglement of molecular chains. In order to overcome this barrier it may be necessary, for example, to change molecular ring structures to molecular chains, or break crosslinks of a chemical, mechanical or other structural nature. One difference between memory materials and typical silicon oxide glasses is that the latter have high energy barriers resulting from highly crosslinked network structures having the effect of resisting devitrification or crystallization. The energy necessary to overcome this barrier would have destructive effects upon other properties of such silicon oxide glasses, for example an irreversible dielectric breakdown. On the other hand memory materials are more lightly bonded allowing variations in molecular chain configurations and different atomic or molecular bond forces. These variations are achieved at lower temperatures than the aforementioned highly crosslinked glasses and are far more responsive to activation by the application of energy. Such energy can include light which is also capable of acting as a scissionary force even at the aforementioned temperature ranges to effectively lower the energy barrier between amorphous and crystalline conditions. The mobility of atoms or molecules at these temperature ranges is much higher in memory materials than in such highly crosslinked glasses thereby allowing crystal growth to occur in the memory materials in a much more rapid and controllable manner utilizing many different processes including photo-induced processes, thermal processes, field assisted processes, and the like. In addition to the energy barrier that exists between the crystalline and amorphous conditions of the memory material, similar energy barriers exist between the other conditions produced by the aforementioned configurational, conformational and positional changes.

Another advantageous feature exhibited by many of the glassy or amorphous memory materials utilized in accordance with the present invention is an easily obtainable exotherm above the glass transition temperature and below the temperature at which melting takes place. Where this characteristic is present in a memory material, it is usually accompanied by the ability to rapidly and controllably reduce the energy barrier between the two desired conditions of the memory material.

Briefly, stated in another way, the memory material in its said one structural condition (the substantially disordered and generally amorphous condition) has internal biasing forces (such as crystallizing forces) biasing the same toward said other structural condition (the more ordered crystalline condition). It also has internal inhibitions against the action of said biasing forces (such as crystallizing inhibiting factors) which operate to inhibit the structural change from said one structural condition to said other structural condition.

More specifically in accordance with this invention, the layer of memory material is also provided with a catalytic material which is capable of relatively increasing the internal biasing forces (the crystallizing forces) and decreasing the internal inhibitions against the action of the biasing forces (the crystallizing inhibiting factors) when activated. Applying energy to the layer of memory material activates the catalytic material at portions of said layer and physically changes or alters said layer at said portions thereof from said one detectable structural condition to said other detectable structural condition. Some activated catalytic materials may operate primarily to increase the internal biasing forces while others may operate primarily to decrease the internal inhibitions against the action of the internal biasing forces. In any event, the activated catalytic material may be considered as operating to decrease the energy barrier for energy applied to physically change or alter the memory material from said one structural condition to said other structural condition. Because of the activation of the catalytic material, less energy is required to bring about the physical change in structure and the structural change is brought about more rapidly.

In this respect, the catalytic material or catalyst can operate to lengthen statistically the life time (relaxation time) of the free carriers generated by the application of the energy to provide longer time periods in which changes in density of traps and band gap, non-equilibrium distribution of carriers, atomic movement and, hence, physical change in structure can take place. Also, the catalytic material or catalyst can operate to speed up the reaction time of the physical change in structure in relation to the relaxation or recombination time of the carriers. Furthermore, the catalytic material or catalyst, which can be dispersed in a matrix of the other materials of the memory material, can serve as nucleation sites so that when energy is applied, the above-described physical changes in structure are initiated at such sites. Where the physical change in structure includes a form of crystallization, catalytic nuclei can serve as templates, epitaxially influencing the geometric form of the crystal structure. Many different forms of catalytic process can be initiated by the applied energy, including chemical changes in the catalyst inducing by photodissociation of components contained therein. Such chemical action need not continue throughout the memory material but acts only as a nucleus for producing physical changes in structure in the matrix of other materials in which the catalysts are dispersed.

In one form of the present invention where nuclei are formed in the memory material in response to the application of energy, it is only necessary to create nuclei of a certain critical size capable of surviving any relaxation or recombination of carriers or atoms after the applied energy is removed. These nuclei thus created can act as a latent image which may be amplified and developed by the subsequent application of energy, either in the same form as originally applied or in one or more other forms as described above, causing the growth of crystals around such nuclei. The catalytic material can also control the number of nuclei and also the size of the crystals formed on the nuclei.

The applied energy may be electrical energy, beam energy, electron beam energy, electromagnetic energy including heat, visible light or ultraviolet energy, accoustical energy, stress or pressure energy, chemical energy, and the like, and combinations thereof. The energy may be applied at selected desired discrete portions of the layer of memory material in accordance with a desired pattern of useful information to record by physical change in structure in the layer the desired pattern of useful information. The energy may be applied by scanning and pulsing techniques or by applying an energy image or the like.

The physically changed or altered portions of the layer have many detectable characteristics which differ from those of the unaltered portions of the layer including, for example, differences in electrical characteristics, such as, resistance, capacitance, charge storing ability and the like, differences in volume and thickness, differences in energy band gap, differences in diffusion constants, differences in solubility and etching characteristics, differences in optical characteristics including their effects upon electromagnetic energy, and the like, all of which can be readily detected for reading out or retrieving the information recorded in the layer of memory material. The detection of the condition of the physically structurally altered portions of the layer, for example, may be by sensing the electrical resistance, the electrical capacitance, the charge placed on the layer including the transfer of pigmented particles held by the charge, the thickness, the diffusion, solubility, wetting and adsorption characteristics as by applying pigmented dies or inks and transferring the same as in printing, the effect upon electromagnetic energy including transmission, refraction, reflection and scattering, and the like. The recorded information may be retrieved by scanning techniques, printing techniques and the like, and in some instances it may be visually observed.

The memory materials may include the memory semiconductor materials disclosed in the aforementioned U.S. Pat. No. 3,271,591 (in connection with the Hi-Lo and Circuit Breaker Devices referred to therein) where there is a physical change in structural state of the semiconductor material and, also, the memory semiconductor materials referred to in the aforementioned U.S. Pat. No. 3,530,441. The memory materials are preferably polymeric structures having covalent bonding and light crosslinking and may include materials containing polymer forming elements, such as, boron, carbon, silicon, germanium, tin, lead, nitrogen, phosphorous, arsenic, antimony, bismuth, oxygen, sulphur, selenium, tellurium, hydrogen, fluorine or chlorine, wherein such materials have the ability to assume a substantially disordered and generally amorphous structural condition and being physically alterable to another structural condition such as toward or to a more ordered crystalline condition. The "amorphous" or "substantially disordered and generally amorphous" structural condition, as referred to herein, is a locally organized disordered solid state condition which is generally amorphous (not crystalline) but which may possibly contain relatively small crystals or crystallites or ring or chain which would probably be maintained in randomly oriented position therein by the crosslinking. Some further examples of such memory materials in accordance with this invention having these characteristics are amorphous selenium, amorphous compositions of selenium with tellurium and/or sulphur wherein the selenium in atomic percent is about 90%, amorphous arsenide compositions, such as, amorphous arsenic, germanium and cadmium materials. These amorphous selenium and arsenic materials are particularly useful where the applied energy is electromagnetic energy in the form of visible light since selenium and arsenic are responsive to and affected by visible light applied thereto.

Further examples of typical memory materials which are operable in the invention include for instance compositions (in atomic percent) of 15% germanium, 81% tellurium, 2% antimony and 2% sulphur or a composition of 83% tellurium and 17% germanium; a composition of 92.5% tellurium, 2.5% germanium, 2.5% silicon and 2.5% arsenic; a composition of 95% tellurium and 5% silicon; a composition of 90% tellurium, 5% germanium, 3% silicon and 2% antimony; a composition of 85% tellurium, 10% germanium and 5% bismuth; a composition of 85% tellurium, 10% germanium, 2.5% indium and 2.5% gallium; a composition of 85% tellurium, 10% silicon, 4% bismuth and 1% thallium; a composition of 80% tellurium, 14% germanium, 2% bismuth, 2% indium and 2% sulphur; a composition of 70% tellurium, 10% arsenic, 10% germanium and 10% antimony; a composition of 60% tellurium, 20% germanium, 10% selenium and 10% sulphur; a composition of 60% tellurium, 20% germanium and 20% selenium; a composition of 60% tellurium, 20% arsenic, 10% germanium and 10% gallium; a composition of 81% telurium, 15% germanium, 2% sulphur and 2% indium; a composition of 90% selenium, 8% germanium and 2% thallium; a composition of 85% selenium, 10% germanium and 5% antimony; a composition of 85% selenium, 10% tellurium and 5% arsenic; a composition of 70% selenium, 20% germanium, 5% thallium and 5% antimony; a composition of 70% selenium, 20% germanium and 10% bismuth; a composition of 95% selenium and 5% sulphur and many more.

The substantially disordered and generally amorphous layer of memory material is preferably a deposited film or layer which may be deposited by vacuum deposition, sputtering, deposition from a solution or the like. The catalytic material with which the layer of memory material is provided, may be distributed in the memory material or it may be applied to the surface of the memory material from an environment which may be vapor, liquid or solid. Examples of catalytic materials which may be used with the aforementioned memory materials, include the halogens, iodine, bromine and chlorine, oxygen, water vapor, alkali metal elements, particularly, sodium and lithium, and easily diffusible metals, particularly, silver, gold, indium and gallium. Organic vapors of carbon disulfide, isopropyl acetate and trichloroethylene and vapors of iodine also form particularly good catalytic materials for the selenium materials. Additions of sulphur, selenium or tellurium also form good catalytic materials for the amorphous arsenic materials. The catalytic material, for example, may be in the form of ions, atoms or molecules of the aforementioned elements or compounds or molecular compounds including the same which, upon activation, provide nucleation centers or the like to initiate structural change in the memory material.

Where the catalytic material is distributed in the layer of memory material, it is preferably deposited along with the memory material during the deposition of the layer of memory material. The distribution catalytic material is not free in the memory material but can be tied up in the amorphous structure and the applied energy can act on the catalytic material preferentially. Where the catalytic material is applied to the surface of the layer of memory material, it may be applied by subjecting the surface to a vapor or liquid containing the catalytic material, or it may be applied by depositing a layer of material containing the catalytic material on the surface of the memory material or by depositing the layer of memory material on a substrate or layer or electrode containing the catalytic material.

The catalytic material which is distributed in the layer of memory material may be activated by energy in the form of an electric field, by pressure or by electromagnetic energy including heat, visible light or ultraviolet energy or combinations thereof. The catalytic material which is applied to the surface of the layer of memory material may be activated by surface conditions of the memory material including roughness, exposed dangling bonds and the like, or by applied energy in the form of an electric field, pressure or electromagnetic energy including heat, visible light or ultraviolet energy or combinations thereof. Regardless of the manner in which the catalytic material is applied to the layer of memory material, the activation of such catalytic material initiates a physical change in structure in the memory material.

The activated catalytic materials may operate essentially only at their positions with respect to the layer of memory material, whether they be dispersed in the memory material or arranged essentially at the surface thereof, or, preferably, they may diffuse or travel in the memory material depending upon gradients through the memory material. Such gradients to cause such diffusion or travel may be passive chemical gradient depending upon relative concentrations of the various elements through the memory material or they may be active gradients brought about by electrical fields, pressure or electromagnetic energy, such as, heat, visible light, ultraviolet energy or the like.

The activated catalytic material in relatively increasing the internal biasing forces of the memory material toward the aforementioned second structural condition (toward the more ordered crystalline condition) and decreasing the internal inhibitions against the action of said biasing forces of the memory material does so in a catalytic manner. In other words, the activated catalytic material operates to initiate or assist in initiating the amorphous to crystalline change in structure of the memory material, which change in structure is the same as that of the aforementioned patents except that the physical change in structure can be accomplished here with the application of less energy and more rapidly.

In this connection, by way of example, selenium, which has a polymeric structure, has in its amorphous condition intertwined randomly oriented long selenium chains and/or rings and this provides the internal crystallizing inhibiting factor which maintains the selenium in its amorphous condition. In its crystalline condition, it has short selenium chains which are oriented and bound by forces, such as, Van der Waal forces or the like, which provide the internal crystallizing or biasing forces toward the crystalline condition. When energy, such as, visible light, is applied to the amorphous selenium material, the catalytic material is activated and can be diffused in the selenium material and it operates to provide nucleation centers and to sever the long chains and/or rings into short chains thereby increasing the crystallizing forces and decreasing the crystallizing inhibiting factor and assisting in the physical change in structure toward the more ordered crystalline condition. Also, the catalytic material, in addition to providing nucleation centers, may operate to terminate the ends of the shortened chains. When the selenium material also includes tellurium or sulphur, as referred to above, such additions will also operate to assist in the physical change in structure toward the more ordered crystalline condition.

Briefly, in this same connection and as another example, where the memory material includes, for example, tellurium and germanium and is in the substantially disordered and generally amorphous structural condition, the activated catalytic material applied thereto may operate to provide nucleation centers about which the constituents of the memory material may crystallize under the influence of the applied energy. This causes a physical change in structural state in the memory material toward a more ordered crystalline like condition. Here, also, the memory material in its amorphous condition has an internal crystallizing inhibiting factor and internal crystallizing or biasing forces toward the crystalline like condition and the activated catalytic material operates to increase the latter and decrease the former.

In at least some of the memory materials, it is necessary to apply energy above a normal threshold value in order to physically change portions of the memory material from one detectable structural condition to the other detectable structural condition. In such memory materials, the activated catalytic material operates to change such normal energy threshold value at which such physical change in structure can take place. In some instances the activated catalytic material can operated to lower the normal energy threshold value and in other instances to raise the same. In the first instances the application of energy above the lowered energy threshold value but below the normal energy threshold value will cause a physical change in structure at those portions of the memory material which contain the activated catalytic material but not at the other portions thereof. In the other instances the application of energy below the raised energy threshold value but above the normal energy threshold value will cause a physical change in structure at those portions of the memory material which do not contain the activated catalytic material but not at the other portions thereof which do not contain the activated catalytic material. Thus, a marked differentiation in structural condition can be obtained between portions of the layer of memory material where the catalytic material is or is not activated.

In other memory materials, the degree of physical change in structure from said one detectable structural condition to said other detectable structural condition may be made dependent upon the amount of energy applied to the layer of memory material and the amount of and effectiveness of the catalytic material. In this way, various degrees of physical change in structure may be obtained (adaptive memory) to provide for "gray scale" recording of the desired information which may be readily observed or retrieved in the manners expressed above. For example, where the physical change in structural condition is from an amorphous condition toward a crystalline condition, the number of crystals and the size of the crystals produced is a form of "gray scale". In other words, the extent of physical change in structure or the amount of detectable physical change in structure with respect to the thickness of the layer of memory material in any portion of the layer (completely through or part way through) may be accomplished as desired to provide such gray scale in recording the information.

In many instances, if not in most or all instances, in accordance with this invention, the physically changed structural condition of the portions of the layer of memory material (the more ordered toward crystalline condition) may, if desired, be reversibly physically changed back to substantially the original structural condition (the substantially disordered and generally amorphous condition) for resetting or erasing the information recorded in the layer by the application of suitable energy pulses to the layer. Such erasing energy pulses operate to break up the more ordered condition and allow return of the memory material to substantially its initial substantially disordered and generally amorphous condition.

In this respect, the memory material in its said other structural condition (the more ordered crystalline like condition) has biasing forces (such as amorphatizing forces) biasing the same toward said one structural condition (the substantially disordered and generally amorphous condition) when subjected to the erasing energy pulses. It also has internal inhibitions (such as crystallizing factors) which operate to inhibit the physical change in structure to said one structural condition. When the energy pulses, such as, for example, heat pulses, are applied, the amorphatizing biasing forces are increased and the inhibitions or crystallizing factors are decreased to provide the physical change in structure to the substantially disordered and generally amorphous condition which is frozen in when the energy pulses are rapidly terminated. In this same connection it is believed that such energy pulses also operate to deactivate the catalytic material and reverse the direction of diffusion or travel of the catalytic material if the energy pulses are in a direction opposite to that of the initial gradient affording such diffusion or travel.

Other objects and advantages of this invention will become apparent to those skilled in the art upon reference to the accompanying specification, claims and drawings in which:

FIG. 1 is a diagrammatic illustration of one manner of obtaining the physical change in structure in the memory material in accordance with this invention wherein the catalytic material is applied to the memory material from a vapor or the like;

FIG. 2 is a diagrammatic illustration showing one manner in which the recorded information may be retrieved from the arrangement of FIG. 1;

FIG. 3 is a diagrammatic illustration similar to FIG. 1 but wherein the vapor or the like containing the catalytic material is trapped;

FIG. 4 is a diagrammatic illustration showing one manner in which the recorded information may be retrieved from the arrangement of FIG. 3;

FIG. 5 is a diagrammatic illustration illustrating another manner of obtaining the physical change in structure in accordance with this invention wherein the catalytic material is applied to the memory material from a disassociatable compound applied to the surface of the memory material;

FIG. 6 is a diagrammatic illustration illustrating one manner of retrieving the recorded information from the arrangement of FIG. 5;

FIG. 7 is a diagrammatic illustration similar to FIG. 5 but illustrating the diassociatable compound arranged between the substrate and the memory material;

FIG. 8 is a diagrammatic illustration of one manner of retrieving the recorded information from the arrangement of FIG.

FIG. 19 is a diagrammatic illustration of a scanning and pulses system for electrically recording a pattern of information on a layer of memory material and for electrically retrieving the recorded information;

Figure 9:
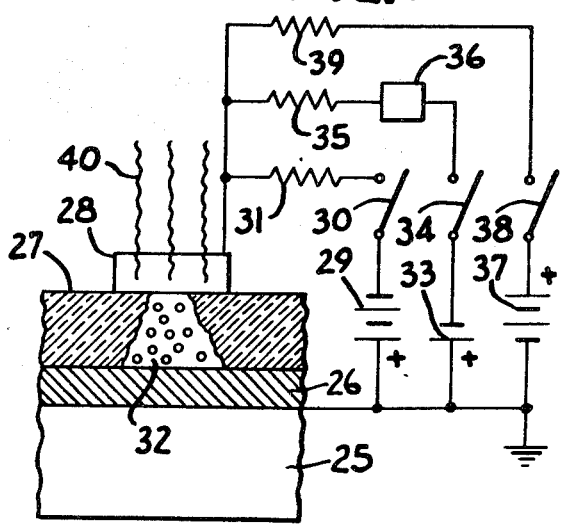
FIG. 9 is a diagrammatic illustration of a further form of this invention wherein the physical change in structure in the memory material is accomplished electrically or in combination with electromagnetic energy and wherein electrical retrieval of the recorded information is utilized.

FIG. 20 is a diagrammatic illustration of one form of a printing apparatus wherein a pattern of information is recorded in a layer of memory material on a drum, wherein the layer of memory material is charged, wherein pigmented particles are adhered to the charged portions of the layer and wherein the pigmented particles are transferred to a carrier; and FIG. 21 is a diagrammatic illustration of another form of printing apparatus wherein a pattern of information is recorded in the memory layer on a drum, wherein pigmented material such as an ink or dye or the like is applied to the memory layer in accordance with the recorded pattern and wherein the recorded pattern of information is printed on a carrier.

Referring first to FIG. 1, an arrangement is illustrated wherein a layer or film of memory material 11, such as, selenium, or selenium with tellurium or sulphur or the like, is deposited on a substrate 10, such as, a transparent glass substrate. The selenium material may be deposited by vacuum deposition or sputtering or deposition from a solution or the like and the deposited selenium material is substantially disordered and generally amorphous with a detectable structural condition. A mask 12 having openings 13 therein arranged in accordance with a desired pattern of useful information is placed over the layer 11 of memory material and is subjected to a catalytic vapor, such as, a relatively highly concentrated iodine vapor. Iodine from the vapor contacts the surface of the selenium layer where exposed by the openings 13 in the mask 12 and acts as a catalytic material for physically changing the structural condition of the exposed surfaces of the layer to another structural condition, such as, toward a more ordered crystalline like condition. By diffusion of the catalytic material into the memory material layer, as by passive chemical diffusion, the depth of the structural change is increased as illustrated at 14 in FIG. 1.

By applying energy to the arrangement of FIG. 1 activation of the iodine for catalytic purposes and the physical change in structure may be enhanced and speeded up. Heat energy is effective toward this end and, hence, the arrangement of FIG. 1 may be heated a slight amount above the normal room temperature to, for example, about 80°C. Electromagnetic energy, such as visible light 15, as illustrated in FIG. 1, is also effective toward this end because of its activation of the iodine for catalytic purposes and at least partially because of its electronic effect upon selenium material. The iodine catalytic material, which is activated by its contact with the surface of the selenium material layer and by the applied energy, operates to relatively increase the internal biasing forces of the selenium material toward the aforementioned second condition (toward the more ordered crystalline like condition) and decrease the inhibitions against the actions of said internal biasing forces and operates to physically change the selenium material from said one structural condition to said other structural condition. The activated catalytic iodine does so in a catalyzing manner and without entering into, except in possible minor amounts, any change in chemical composition of the selenium material.

The extent and amount of physical change in structure from said first structural condition to said second structural condition is dependent upon the amount of and the effectiveness of the activated catalytic iodine and the amount of the applied energy including the values thereof and the length of time of application thereof. Thus, the extent of physical change in structure and the depth of the physical change in the selenium material layer may be regulated as desired, and, in fact, the physical change in structure may be made to extend entirely through the layer. The two structural conditions have different detectable characteristics, as expressed above, which may be readily sensed for information retrieving purposes. The various degrees of physical change in structure provide for gray scale retrieving of the recorded information.

FIG. 2 illustrates one manner of retrieving the pattern of information recorded in the layer 11 of memory material. Here, after the mask 12 has been removed following the recording step, a beam 16 of electromagnetic energy, such as visible light, may be scanned over the layer 11 and the effect of the layer on the beam detected during such scanning. The layer 11 in its substantially disordered and generally amorphous condition has very little, if any, effect upon the light beam 16. When, however, the light beam 16 is directed at the portion 14 of the layer, the portion 14 has a decided effect thereon. For example, it operates to reflect and/or scatter the light which may be readily detected by sensing such reflection and/or scattering from the same side of the layer or by sensing from the other side of the layer the decrease in light passing therethrough. Also, the portion 14 of the layer 11 will refract the light differently than the remainder of the layer and this refraction may be readily sensed. In addition, where an image is recorded in the layer 11, this image may be visually observed.

The pattern of information recorded at 14 in the layer 11 may be reset or erased by applying an energy pulse to the layer 11, such as, a heat pulse followed by rapid cooling. The heat pulse operates to vaporize and drive the iodine from the selenium material layer and to cause the portions to assume substantially the initial substantially disordered generally amorphouos condition which is frozen in upon the subsequent rapid cooling. A new pattern of information may then be recorded in the layer in the manner pointed out above.

The arrangement illustrated in FIG. 3 is somewhat similar to the arrangement of FIG. 1, it having a substantially disordered and generally amorphous layer or film of memory material 11, such as, selenium, or selenium with tellurium or sulphur or the like, deposited on a substrate 10, such as, a transparent glass substrate. However, in FIG. 3, a transparent cover 18, such as, transparent glass, is sealed over the layer or film 11 with a sealed space 17 provided therebetween. This space 17 is provided with a catalytic vapor, such as, iodine vapor of relatively low concentration. The iodine vapor contacts the entire surface of the selenium material layer, but preferably due to its relatively low concentration and the existence of normal temperature, such as, room temperature, it has no substantial immediate effect upon the selenium material. The iodine vapor, however, is capable of acting as a catalytic material, when activated by energy, for physically changing the structure of the selenium material layer to another structural condition, such as, toward a more ordered crystalline like condition.

In FIG. 3, the applied energy is illustrated to be electromagnetic energy 19 including visible light which may be applied in a desired pattern of useful information, as by, for example, optical image techniques or scanning and pulsing techniques or the like. Where the electromagnetic energy 19 strikes the selenium material layer and the iodine thereat, it activates the iodine to form an activated catalytic material to relatively increase the internal biasing forces of the selenium material toward the more ordered crystalline like condition and decrease the inhibitions against the action of said internal biasing forces and operates to physically change the selenium material from the substantially disordered and generally amorphous condition toward the more ordered crystalline like condition as indicated at 14 in FIG. 3. Heat energy may also be utilized to enhance and speed up the physical change in structure as expressed above in connection with FIG. 1. Also, the extent and amount of physical change in structure may be regulated as desired as expressed above with respect to FIG. 1.

FIG. 4 illustrates one manner of retrieving the pattern of information recorded in the layer of memory material 11 of the arrangement of FIG. 3. Since the cover 18 is transparent, a beam 16 of electromagnetic energy, such as, visible light, may be scanned over the layer 11 through the cover 18 and intervening space 17 and the effect of the layer on the beam 16 detected during such scanning as described above in connection with FIG. 2. Also, where an image is recorded in the layer 11, this image may be visually observed. The pattern of information 14 recorded in the layer 11 of the arrangement of FIGS. 3 and 4 may be reset or erased by applying an energy pulse to the layer, such as, a heat pulse, followed by rapid cooling as expressed above in connection with FIGS. 1 and 2. Here, however, the iodine which is driven from the selenium material layer becomes trapped in the space 17 under the cover 18 so that it is again available for recording a new pattern of information in the layer in the manner pointed out above.

With reference to FIGS. 1 to 4, other vapors than iodine vapors as the catalytic material may be utilized, as for example, the other halogen vapors or the organic vapors of carbon disulfide, isopropyl acetate or trichlorethylene, or the like. Also, within the purview of this invention, the memory material may include other substantially disordered and generally amorphous materials, such as, for example, selenium with additions of tellurium and/or sulphur or the like, as expressed above, and other memory materials such as the arsenic materials as mentioned above which are catalytically affected by the aforementioned vapors to aid the aforementioned physical change in structure therein.

In the arrangement of FIG. 5, which utilizes a layer or film of substantially disordered and generally amorphous memory material 11, such as, selenium, or selenium with tellurium or sulphur or the like, deposited on a substrate 10, such as, a transparent glass substrate, as in FIGS. 1 and 3, also has a layer or film 21 of a visible light disassociatable compound, as for example, silver iodide, deposited thereon. The silver iodide may be deposited in any suitable manner as by vacuum deposition, sputtering or the like or by first depositing a silver film or layer and then subjecting the same to iodine vapor to form the silver iodide. When energy in the form of electromagnetic energy 19 including visible light is applied to the layer 21 of the visible light disassociatable silver iodide compound, that compound is disassociated into silver and iodine, either or both of which constitute a catalytic material for catalytically initiating a physical change in structure in the selenium memory material from its substantially disordered and generally amorphous condition toward its more ordered crystalline like condition.

In FIG. 5, the electromagnetic energy 19 including visible light is applied in a desired pattern of useful information, as by, for example, optical image techniques or scanning and pulsing techniques or the like. Where the electromagnetic energy 19 contacts the light disassociatable silver iodide compound layer 21, it disassociates the compound into the catalytic silver and iodine, as indicated at 22, which contact the surface of the selenium memory material 11. The electromagnetic energy 19 also activates the disassociated silver and/or iodine catalytic material 22 and physically changes the memory material at 14 from the substantially disordered and generally amorphous condition toward the more ordered crystalline like condition, the catalytic material 22 initiating or assisting in the initiation of the physical change in structure of the memory material 11 at 14 as expressed above. Heat energy may also be utilized to enhance and speed up the physical change in structure and the extent and amount of physical change in structure may also be regulated as desired, all as also expressed above.

FIG. 6 illustrates one manner of retrieving the pattern of information so structurally recorded at 14 in the layer of memory material 11. Here, the layer or film of the visible light disassociatable compound 21 and the disassociated elements thereof 22 are removed from the surface of the layer of memory material 11 and a beam 16 of electromagnetic energy, such as, visible light, is scanned over the layer of memory material 11 and the effect of the layer on the beam 16 is detected during such scanning as described above in connection with FIGS. 2 and 4. Also, where an image is recorded in the layer 11, this image may be visually observed. The pattern of information 14 recorded in the layer 11 may be reset or erased by applying an energy pulse to the layer, such as, a heat pulse, followed by rapid cooling as expressed above in connection with FIGS. 1 and 2.

The arrangement of FIGS. 7 and 8 corresponds to that of FIGS. 5 and 6 except that the layer of the visible light disassociatable compound 21 is disposed between the substrate 10 and the layer of memory material 11. Here, the manner of recording the pattern of information in the layer of memory material 11 and the manner or retrieving the recorded information are like those described above in connection with FIGS. 5 and 6 and what has been previously stated applies equally as well here. Here, however, the electromagnetic energy 19 penetrates through the layer of memory material 11 to disassociate the catalytic material at 22 from the layer of the visible light disassociatable compound 21 and to activate the catalytic material to initiate or assist in initiating the physical change in structure at 14 in the layer of memory material 11. Also, since the layer of visible light disassociatable material 21 is located between the substrate 10 and the memory material 11, it remains in place while retrieving the recorded information, as illustrated in FIG. 8, and has no deleterious effect upon such information retrieval. Here, also, since the silver iodide 21 and the silver and iodine 22 are trapped between the substrate 10 and the layer of memory material 11, they are still available for further recording purposes after the instant recording is reset or erased by the application of an energy pulse as described above.

The arrangement of FIGS. 7 and 8, in addition to being admirably suitable for information recording and retrieval puposes utilizing scanning techniques and the like, it is also particularly suitable for photographic purposes where an image may be optically structurally recorded therein and readily visually observed, this all being accomplished without the need for developing, or fixing steps and the like as are normally required in conventional photography.

In the arrangement of FIG. 9 an electrode 26 is deposited on a substrate 25, the electrode 26 including a catalytic material. In this respect it may include alkali metal elements, particularly, sodium and lithium or easily diffusable metals particularly, silver, gold, indium, or gallium, or other catalytic materials such as the halogens and their compounds. As a specific example, the electrode 26 may be formed of a conductive sodium oxide glass. The electrode 26 may be deposited in any suitable manner on the substrate 25 as by vacuum deposition, sputtering, deposition from a solution or the like. A film or layer of memory material 27 is deposited over the electrode 26 and it may comprise any of the various memory materials specified above. As a specific example, it may comprise a substantially disordered generally amorphous layer containing tellurium and germanium wherein the tellurium is substantially 85% in atomic percent, or the other compositions specifically specified above or in the above-identified patents. The layer 27 of memory material may also be suitably deposited as by vacuum deposition, sputtering or deposition from a solution or the like. An electrode 28 is deposited over the memory material 27 and this electrode may be any suitable conductor. Where light energy is to be utilized in connection with the operation of the arrangement of FIG. 9, the electrode 28 is preferably made transparent and may comprise tin oxide or the like.

At least a portion of the memory material 27 may be physically changed in structure from its substantially disordered and generally amorphous condition toward a more ordered crystalline like condition by applying electrical energy to the electrodes 26 and 28. In this connection electrical energy is applied by a voltage source 29 having the positive side connected to the electrode 26 and the negative side connected through a switch 30 and a resistor 31 to the electrode 28. When the switch 30 is closed, a voltage above a threshold voltage value is applied to the electrodes 26 and 28 to cause the memory material 27 to switch to a low resistance condition between the electrodes 26 and 28. At the same time, the catalytic material in the electrode 26 is activated and due to the electrical gradient between the electrodes 26 and 28 the catalytic material is caused to diffuse into the memory material 27 to catalytically initiate or aid in initiation of the physical change in structure from the substantially disordered and generally amorphous condition to the more ordered crystalline like condition as indicated at 32 in FIG. 9. This more ordered crystalline like condition 32 is frozen in the memory material layer 27 and remains even though the switch 30 is opened. As a result, the memory material 32 between the electrodes 26 and 28 has a different structural condition than the remainder of the layer of the memory material 27 and this different structural condition may be readily detected. One of the detectable characteristics of the more ordered crystalline like condition 32 is a substantially lower resistance value than is present in the remainder of the memory material layer 27.

This decrease in electrical resistance may be electrically detected by means of a read circuit including a voltage source 33 having its positive side connected to the electrode 26 and its negative side connected through a switch 34, a detector 36 and a resistance 35 to the electrode 28. The voltage source 33 has a value less than the threshold value of the memory material 27 and the resistance 35 is of such value as to limit substantially the amount of current flow through the portion 32 of the memory material. When the switch 34 is closed and the layer of memory material 27 is in its substantially disordered and generally amorphous condition of high resistance, there will be substantially no current flow and this will be detected by the detector 36. When, however, the memory material between the electrodes 26 and 28 is in its substantially more ordered crystalline like condition as indicated at 32, current will flow through the read circuit and this current will be detected by the detector 36. Thus, the detector 36 will operate to detect the condition of the memory material between the electrodes 26 and 28.

The more ordered crystalline like condition 32 of the memory material may be physically changed or realtered back to the substantially disordered and generally amorphous condition electrically by a reset or erase circuit including a voltage source 37 having the negative side thereof connected to the electrode 26 and the positive side thereof connected through a switch 38 and a resistance 39 to the electrode 28. The voltage source 37 has a value less than the threshold voltage value of the memory material and the resistance 39 is relatively small so that a substantial current is caused to flow through the memory material between the electrodes 26 and 28. This high current flow operates to disrupt the more ordered crystalline like condition and physically change or realter the more ordered substantially crystalline like condition to the substantially disordered and generally amorphous condition which latter condition is frozen in upon opening of the switch 38. Also, during this resetting or erasing operation the direction of current flow is such as to drive the catalytic material from the layer of memory material 27 back toward the electrode 26, this being due to the particular polarity of the voltage source 37 in the reset or erase circuit. The electrode 28 and the layer of memory material 27 may be made movable with respect to each other so that a pattern of information may be structurally recorded in the layer of memory material, read out and erased by suitable scanning and pulsing techniques.

Other energy such as electromagnetic energy 40 including visible light may be utilized in conjunction with the electrical energy for physically changing in structure the layer of memory material 27 from its substantially disordered and generally amorphous condition to its more ordered crystalline like condition 32. This electromagnetic energy 40 may pass through the transparent electrode 28 as indicated in FIG. 9 and operate additionally to activate the catalyzing material as expressed above in connection with FIGS. 1, 3, 5 and 7. In this respect the voltage source 29 may be so selected as to be below the threshold voltage value of the memory material 27 so that it in itself cannot cause the structural change. When, however, the electromagnetic energy 40 is applied through the transparent electrode 28, this energy will be additive to the electrical energy so as to cause the physical change in structure. By so doing, the physical change in structure may be brought about selectively by the application of the electromagnetic energy with less electrical energy required.

The extent and amount of physical change in structure may be regulated by the amount of energy applied to the memory material 27 whether the variation is in the electrical energy or the electromagnetic energy or both in substantially the same manner as discussed above in connection with FIGS. 1, 3, 5 and 7. This variation in physical change in structure may be electrically detected by the detector 36 so that a "gray scale" recording and detection may be obtained.

Figure 10:
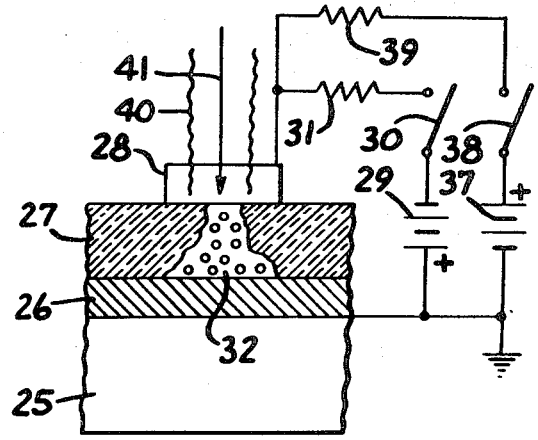
FIG. 10 is a diagrammatic illustration of an arrangement similar to FIG. 9 but retrieving the recorded information by the effect of the memory material on electromagnetic energy.

The arrangement of FIG. 10 is the same as that of FIG. 9 and what has been said above in connection with FIG. 9 applies equally as well here. In the arrangement of FIG. 10, however, the detection of the physical change in structure is by detecting the effect of the layer of memory material 27 on an electromagnetic beam such as one including visible light as indicated at 41, the manner of such detection being like that explained above in connection with FIGS. 2, 4, 6 and 8. As a result, the read circuit of FIG. 9 is not utilized in the arrangement of FIG. 10.

Figure 11:
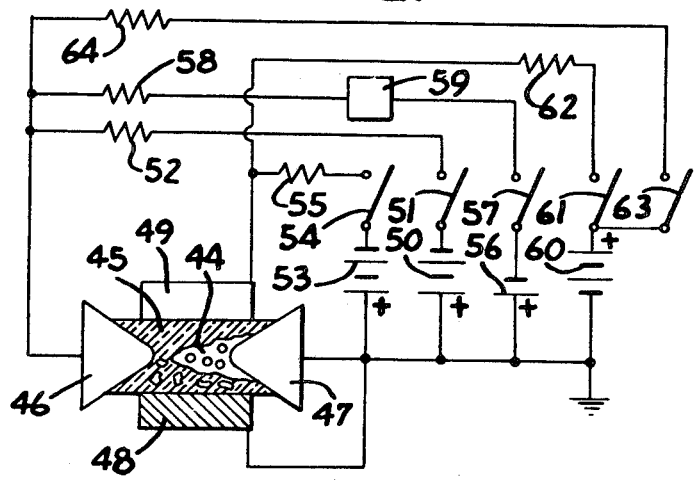
FIG. 11 is a diagrammatic illustration similar to FIG. 9 but utilizing four electrodes instead of two electrodes as in the arrangement of FIG. 9.

In the arrangement of FIG. 9 two electrodes are utilized. The arrangement of FIG. 11 differs from that of FIG. 9 basically in that four electrodes are used. Here, a layer of memory material 45 like that described above in connection with FIG. 9 is deposited between a pair of load electrodes 46 and 47, the load electrodes 46 and 47 being formed of any suitable electrically conducting material. On opposite sides of the layer 45 of memory material there are deposited an electrode 48 and an electrode 49, the electrode 48 being like the electrode 26 of FIG. 9 and containing catalytic material. A source of voltage 50 has its positive side connected to the load electrode 47 and its other side connected through a switch 51 and a resistance 52 to the load electrode 46. The voltage source 50 has a value which is less than the threshold voltage value of the memory material 45 so that upon closure of the switch 51 it will not in itself cause a physical change in structure in the memory material 45. A voltage source 53 has its positive side connected to the electrode 48 containing the catalytic material and its other side connected through a switch 54 and a resistance 55 to the electrode 49. When the switch 54 is closed, the catalytic material of the electrode 48 is activated and due to the electrical gradient across the memory material 45 the catalytic material is caused to diffuse or travel into the memory material 45. This activated catalytic material as it diffuses between the electrodes 46 and 47 operates to initiate a physical change in structure between the electrodes 46 and 47 from the substantially disordered and generally amorphous condition to the more ordered crystalline like condition as indicated at 44 when the switch 51 is closed. The extent and amount of such physical change in structure may be regulated by controlling the amount of energy applied by the voltage sources 50 and 53. As indicated in FIG. 11 the physical change in structure has not been completed all the way between the electrodes 46 and 47 but by the addition of more energy this can be done. The physical change in structure occuring at 44 operates to decrease the resistance between the electrodes 46 and 47 and this decrease in electrical resistance may be detected by a read circuit including a voltage source 56 having its positive side connected to the electrode 47 and its outer side connected through a switch 57, detector 59 and resistance 58 to the electrode 46. This read circuit operates in the same manner as the read circuit of FIG. 9 and what was said there applies equally as well here.

The structurally altered portion 44 of the memory material may be physically changed or realtered from its more ordered crystalline like condition back to its substantially disordered and generally amorphous condition by reset or erase circuits including a voltage source 60. The voltage source 60 has its negative side connected to the load electrode 47 and the electrode 48 including the catalytic material. The positive side of the voltage source 60 is connected through a switch 61 and resistance 62 to the electrode 49 and through a switch 63 and resistance 64 to the load electrode 36. When the switch 61 is closed, the voltage source 60 operates to drive the catalytic material back toward the electrode 48 and when the switch 63 is closed, the voltage source operates to produce a high current flow between the electrodes 46 and 47 to disrupt the more ordered crystalline like condition 44 and physically change or realter the same to the substantially disordered and generally amorphous condition. This substantially disordered and generally amorphous condition is frozen in when the switches 61 and 63 are opened.

Figure 12:
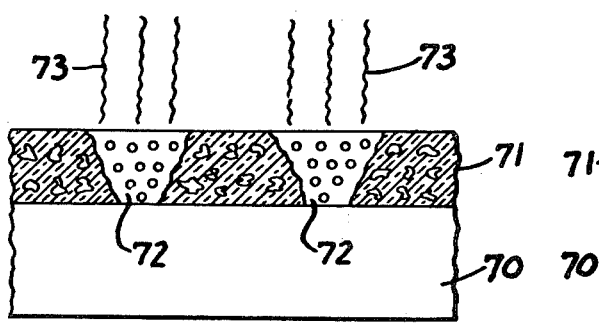
FIG. 12 is a diagrammatic illustration of another arrangement of this invention wherein the catalytic material is distributed in the memory material and is activated by electromagnetic energy similar to the arrangements of FIGS. 1, 3, 5 and 7.

In the arrangement of FIG. 12 a film or layer 71 of memory material is deposited on a substrate 70 which may be made of glass or the like. The layer of memory material 71 may be any of the memory materials referred to above and in the aforementioned patents and it includes catalytic material distributed substantially uniformly throughout. The catalytic material may include any of the various catalytic materials set forth above. The layer of memory material 71 and the catalytic material distributed therein may be deposited on the substrate 70 in any suitable manner such as by vacuum deposition, sputtering, deposition from a solution or the like. The layer of memory material 71 is substantially disordered and generally amorphous and the catalytic material is contained in the substantially amorphous network.

When energy such as electromagnetic energy including light is applied to the layer 71 as indicated at 73 in FIG. 12, the catalytic material in the layer of memory material is activated to initiate a physical change in structure from the substantially disordered and generally amorphous condition toward the more ordered crystalline like condition as illustrated at 72. In this respect, it is believed that the activated catalytic material operates as nucleation centers for the memory material to initiate or aid in initiating the physical change in structure. To assist and hasten the physical change in structure additional energy may be applied, such as, heat or the like. As stated above, the electromagnetic energy may be applied in a desired pattern of information to the layer of memory material by scanning and pulsing techniques or by optical image techniques as desired. As one example, a complete physical change in structure in the layer of memory material at desired portions of the layer of memory material can be accomplished through suitable optical image techniques by applying a short pulse of energy of less than 15 milliseconds duration from a conventional Xenon electronic flash gun.

Figure 13:
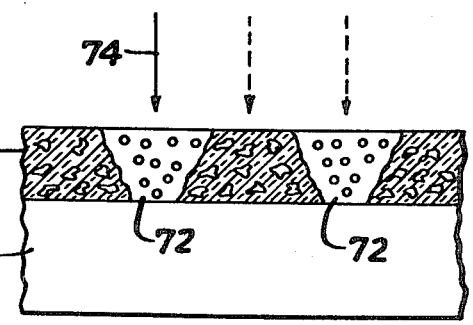
FIG. 13 is a diagrammatic illustration showing one manner for retrieving the recorded information from the arrangement of FIG. 12.

The pattern of information which is structurally recorded in the layer of memory material 71 may be retrieved by detecting the effect of the memory material on electromagnetic energy such as on a beam thereof including visible light as indicated at 74 in FIG. 13. This detection may be in the manner described above in connection with FIGS. 2, 4, 6 and 8 and may include scanning techniques. Where the pattern of information is in the form of an image, this image may be directly observed. Furthermore, in the arrangements of FIGS. 2, 4, 6, 8 and 13 where an image of visible information is structurally recorded in the layer of memory material, such layer of memory material may be utilized as a transparency for optical projection purposes, as in a slide projector or the like, or as a transparency for photoreproduction purposes, or the like. In addition, such recorded images of visible information in such arrangements may be utilized for printing or other reproduction purposes.

Generally speaking, the arrangements of FIGS. 12 and 13 are like those of FIGS. 1 to 8 with the exception that the catalytic material is applied to the layer of memory material 71 by distributing the same therein while in the arrangements of FIG. 1 to 8 the catalytic material is applied to the surface of the layer of memory material. The arrangement of FIGS. 12 and 13, in addition to optical retrieval of desired information, is particularly useful for photographic, transparency and reproduction purposes. The more ordered crystalline like portions 72 of the memory material may be physically changed or realtered to the substantially disordered and generally amorphous condition by applying a pulse of energy thereto as expressed above in connection with FIGS. 1 to 8.

Figure 14:
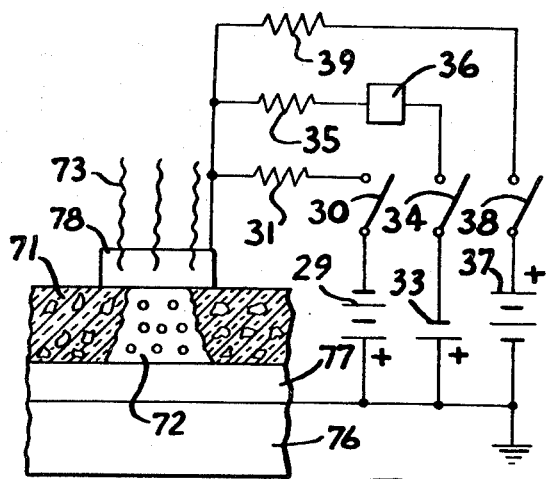
FIGS. 14 and 15 are diagrammatic illustrations of arrangements similar to the arrangements of FIGS. 9 and 10 but wherein the catalytic material is distributed in the memory material.
Figure 15:
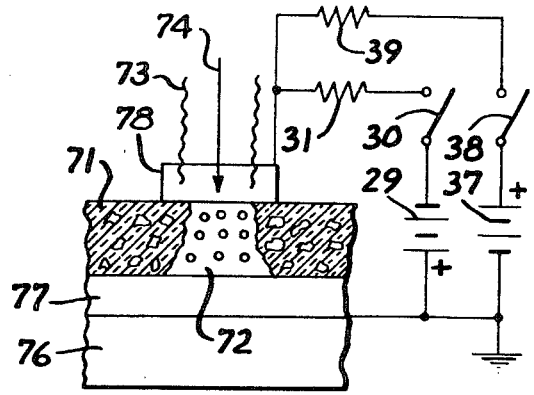

The arrangements of FIGS. 14 and 15 correspond to the arrangements of FIGS. 9 and 10, respectively, with the exception that the catalytic material is dispersed in the memory material as in FIGS. 12 and 13. Here, an electrode 77 of any suitable conducting material is deposited on a substrate 76 and the memory material 71 including the catalytic material distributed therein is deposited on the electrode 77. Another electrode 78 is deposited over the memory material 71 and this electrode 78 as well as the electrode 77 may be transparent such as by forming the same from tin oxide or the like. The operations of the arrangements of FIGS. 14 and 15 are the same as those disclosed above in connection with FIGS. 9 and 10 and what has been said there applies equally as well here. Here, as in FIGS. 9 and 10, the arrangements of FIGS. 14 and 15 may also be subjected to electromagnetic energy 73 including visible light assisting in the physical change in structure of the substantially disordered and generally amorphous memory material to the more ordered crystalline like condition. Instead of electrically detecting the structural change, the structural change may be detected by sensing the effect of the memory material 71 on a beam of electromagnetic energy 74 including visible light as illustrated in FIG. 15 and as expressed above in connection with FIG. 10.

The various forms of energy applied to the layer of memory material to cause the physical change in structure therein, as for example, visible light and heat in the embodiments of FIGS. 1, 3, 5, 7 and 12 or visible light and electrical field in the embodiments of FIGS. 9, 10, 11, 14 and 15, may be applied simultaneously so that the activation of the catalytic material and the physical change in structure of the memory material occur substantially simultaneously, i.e. in rapid succession in a short interval of time, of the order of seconds or fractions of a second as distinguished from minutes or longer. Because of the activation of the catalytic material, the physical change in structure in the memory material is also accomplished with lesser amounts of energy in the short time interval as compared to a memory material which does not have such catalytic material.

On the other hand, the various forms of energy may be sequentially applied for accomplishing the end results. In the examples expressed above, the light energy, or the light energy with a lesser amount of the heat or electrical energy, may be first applied to activate the catalytic material and form a latent image of the activated catalytic material in the layer of memory material. Then, by the subsequent application of the other heat or electrical field energy to the layer of memory material, the physical change in structure takes place in those portions of the layer of memory material where the catalytic material has been previously activated to develop the latent image. Here, also, a lesser amount of total energy is required by reason of the activation of the catalytic material. In both instances, the physical change in structure in the layer of memory material occurs substantially only in those portions of the layer where the catalytic material is activated with substantially no physical change in structure occuring in those portions of the layer where the catalytic material is not activated, thereby providing substantial contrast between the detectable characteristics of the respective portions of the layer of memory material.

The catalytic material also has the property of affecting the normal energy threshold value of those memory materials which require the application of energy above the normal threshold value thereof to physically change portions of such memory material from one structural condition to the other. The catalytic material can operate to change such normal threshold value by raising the same or lowering the same. The various catalytic materials described above, in addition to initiating or aiding in the initiation of the structural change to the more ordered toward crystalline condition, also in many instances have the effect of lowering the energy threshold value. In these instances the application of energy above the lowered energy threshold value but below the normal energy threshold value will cause a physical change in structure at those portions of the memory material which contain the activated catalytic material but not at the other portions thereof.

Other materials, such as arsenic or the like, have an amorphatizing or crystallization inhibiting effect if applied to the various aforementioned memory materials and activated. It is believed that they have the effect of increasing the crosslinking effects in the amorphous memory materials. These amorphatizing or crystallization inhibiting materials, also referred to herein as a catalytic material in certain of the claims, additionally have the effect, when activated, or raising the normal energy threshold value of the memory material. In these instances the application of energy below the raised energy threshold value but above the normal energy threshold value will cause a physical change in structure at those portions of the layer of memory which do not contain the activated catalytic material but not at the other portions thereof which do contain the activated catalytic material. Thus, here, as well as in the other instances, a marked differentiation in structural condition can be obtained between portions of the memory material where the catalytic material is or is not activated.

Figure 16:
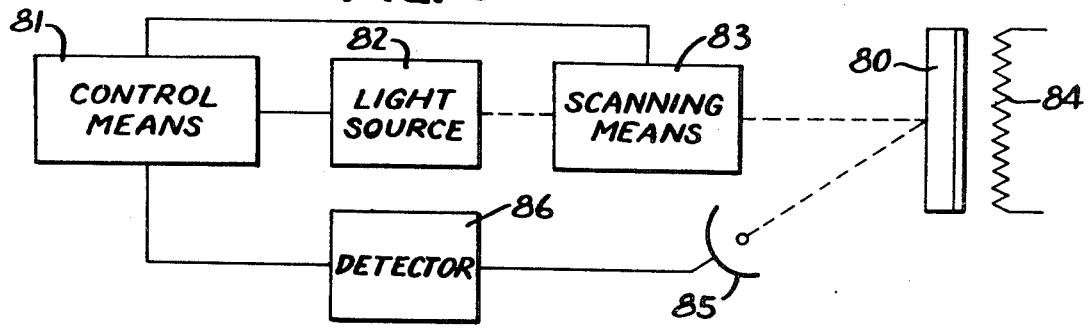
FIG. 16 is a diagrammatic illustration of a scanning and pulsing system utilizing electromagnetic energy including visible light for recording a pattern of information on a layer of memory material and for retrieving such information.

FIG. 16 illustrates a scanning and pulsing system utilizing electromagnetic energy including visible light for recording a pattern of information in a memory layer 80 and for retrieving the information so recorded. A control means 81 which may be controlled by a computer or the like operates to modulate a light source 82 and to control a scanning means 83, the light source 82 providing a beam of visible light and the scanning means directing the light beam to desired portions of the layer of memory material 80. The light source 82 and the scanning means 83 under the control of the control means 81 records in the layer of memory material 80 a desired pattern of useful information, the layer of memory material 80 being provided with catalytic material to facilitate the recording of the information in the manners expressed above. A heater 84 may be utilized for heating the layer 80 of memory material to assist in the recording. In lieu of the heater 84 an electrical gradient may be provided in the manner discussed above in connection with FIGS. 9 and 10 to assist in the recording of the information. The system of FIG. 16 may also include means for retrieving the information recorded in the layer 80. Here, the light source 82 is unmodulated and the beam of visible light is scanned by the scanning means across the layer 80 of memory material. The effect of the memory material on the beam of visible light is sensed by a sensor 85, such as, a photocell or the like, the sensing being detected by a detector 86 which is keyed with the control means.

Figure 17:
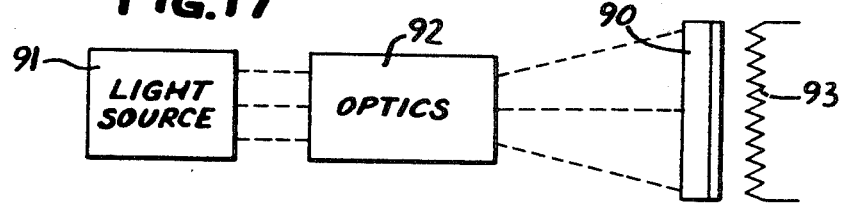
FIG. 17 is a diagrammatic illustration of an optical system for recording an image pattern on a layer of memory material and utilizing visible light.

FIG. 17 diagrammatically illustrates an optical system for recording an image pattern of information on a layer of memory material 90 having catalytic material applied thereto. Here, a collimated light source 91 is controlled by an optical system 92 for recording the image pattern on the layer of memory material 90. The optical system 92 may include a transparency or a series of lenses, apertures, shutters or the like as are contained in a conventional camera. A heater 93 may be utilized for heating the layer of memory material 90 to assist in the recording of the image pattern therein. In lieu of the heater 93 an electrical gradient may be applied to the layer of memory material 90 in a manner similar to that described above in connection with FIGS. 9 and 10. The image pattern recorded in the layer of memory material 90 may be visually observed.

Figure 18:
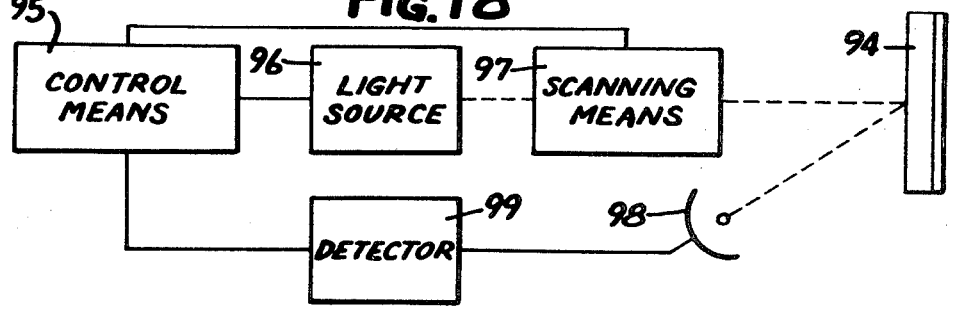
FIG. 18 is a diagrammatic illustration of an information retrieval system utilizing electromagnetic energy including visible light for retrieving information recorded on a layer of memory material.

FIG. 18 is a diagrammatic illustration of an information retrieving system utilizing an electromagnetic beam including visible light for retrieving a pattern of information recorded in a layer of memory material 94 regardless of the manner in which the information is recorded in the layer 94. Here, a control means 95 controls a light source 96 and a scanning means 97 to cause a light beam to scan the layer of memory material 94 having the pattern of information recorded therein. The effect of the layer of memory material 94 on the light beam is sensed by a sensor 98 such as a photocell or the like and such sensing is detected by a detector 79 keyed with the control means 95. This retrieval system may be utilized for retrieving the recorded information regardless of whether the information was recorded in accordance with FIGS. 1, 3, 5, 7 and 12 or in accordance with FIGS. 9, 10, 14 and 15.

FIG. 19 diagrammatically illustrates a scanning and pulsing system for electrically recording a pattern of information in a layer of memory material 100 and for electrically retrieving the recorded information. Here, a control means 101 controls a voltage source 102 and a scanning means 103. The scanning means 103 may carry a bracket 104 which is moved upwardly and downwardly in the direction of the arrows and the bracket 104 may include a plurality of horizontally arranged electrical contacts 105 engaging the layer of memory material 100. By selectively applying electrical energy to the various contacts 105 and by moving the bracket 104 and, hence, the contacts 105 upwardly and downwardly a desired pattern of information may be recorded in the layer of memory material 100 in the manners discussed above in connection with FIGS. 9, 10, 14 and 15. The same arrangement may be utilized for electrically detecting the pattern of information recorded in the layer of memory material 100 by a detector 106 in the manners discussed above in connection with FIGS. 9, 10, 14 and 15, the detector being keyed to the control means 101.

In FIG. 20 a scanning means such as illustrated in FIGS. 16 and 19 or an optical means such as illustrated in FIG. 17, designated here as 111, may be utilized for recording a desired pattern of information in a layer of memory material 110 carried by a rotating drum. The pattern of information recorded on the layer of memory material 110 has portions of different resistance, as expressed above, in the pattern of information and those portions are variably charged by a charge generator 112. The charged portions of the pattern of information attract pigmented particles such as triboelectric particles from a container 113. These adhered pigmented particles are transferred to a carrier 114 held against the layer of memory material 110 by a roller 115, the transferred pigmented particles being indicated at 116. A heater 117 operates to firmly affix the transferred pigmented particles 116 to the carrier 114. There is, thus, provided in FIG. 20 one form of a printing apparatus for printing the recorded information on the carrier. Since the memory material 110 has memory of its condition, substantially infinite numbers of reproductions may be made. If it is desired to remove the recorded information from the layer of memory material 110, this may be accomplished by the reset means 118 in the manners discussed above.

In FIG. 21 there is diagrammatically illustrated another printing apparatus and it may include a scanning means such as illustrated in FIGS. 16 and 19 or an optical means such as illustrated in FIG. 17, and here designated at 121, for recording a pattern of information on a layer of memory material 120 carried by a rotating drum. The various portions of the layer of memory material 120 have different wetting and adsorbing characteristics as discussed above. A pigment such as a dye or ink is applied to the layer of memory material 120 from a pigment supply 122, the pigmented material adhering to portions of the layer of memory material 120 and not to others in accordance with the pattern of information recorded in the layer. The adhered pigmented material is transferred to or printed on a carrier 123 which is held against the layer of memory material 120 by a roller 124. A wiper 125 operates to clean the surface of the layer of memory material 120 following the transfer of the pigmented material to the carrier 123. Since the layer 120 of memory material has memory of its condition innumerable reproductions of the recorded pattern of information may be made. When it is desired to erase the pattern of information from the layer of memory material 120, this may be accomplished by the reset means 126 in the manners discussed above.

The layers of memory material in FIGS. 16 to 21 are all provided with a catalyzing material as expressed above in connection with FIGS. 1 to 15 so that the recording of the information thereon may be accomplished with the application of the least amount of energy and in the most rapid manner.

While for purposes of illustration, several forms of this invention have been disclosed, other forms thereof may become apparent to those skilled in the art upon reference to this disclosure and, therefore, this invention is to be limited only by the scope of the appended claims.

I claim:

1. The method of recording information comprising the steps of: providing a layer of substantially disordered and generally amorphous memory material which has one structural condition which is substantially disordered and generally amorphous and having one detectable characteristic, which is capable of having discrete portions thereof physically changed to another structural condition having another detectable characteristic, which has internal biasing forces toward said other structural condition, and which has internal inhibitions against the action of said biasing forces; providing said layer with a catalytic material which is catalytically capable of relatively increasing said biasing forces and decreasing said inhibitions against the action of said biasing forces of the memory material; and selectively, at selected desired discrete portions of the layer of memory material in accordance with a desired pattern of useful information, activating the catalytic material at said selected desired discrete portions of the layer and physically changing said layer at said selected desired discrete portions from said one detectable structural condition which is substantially disordered and generally amorphous to said other detectable structural condition to record the desired pattern of useful information in said layer.

2. The method as defined in claim 1 wherein the step of activating the catalytic material and physically changing the structural condition of the layer of memory material at said selected desired portions includes applying energy to said layer.

3. The method as defined in claim 2 wherein the applied energy substantially simultaneously activates the catalytic material and physically changes the structural condition of the layer of memory material at said selected desired portions.

4. The method as defined in claim 2 wherein the energy is sequentially applied for first activating the catalytic material at said selected desired portions and then physically changing the structural condition of the layer of memory material at said selected desired portions where the catalytic material has been activated.

5. The method as defined in claim 1 wherein said catalytic material is applied to the surface of the layer of memory material.

6. The method as defined in claim 2 wherein said catalytic material is applied to the surface of the layer of memory material at said selected desired portions thereof.

7. The method as defined in claim 2 wherein said catalytic material is applied to the surface of the layer of memory material and said energy is applied to said layer at said selected desired portions thereof.

8. The method as defined in claim 2 wherein said catalytic material is substantially uniformly distributed throughout the layer of memory material, and said energy is applied to said layer at said selected desired portions.

9. The method as defined in claim 2 wherein the applied energy includes electromagnetic energy.

10. The method as defined in claim 2 wherein the applied energy includes visible light.

11. The method as defined in claim 2 wherein the applied energy includes heat.

12. The method as defined in claim 2 wherein the applied energy includes electrical energy.

13. The method as defined in claim 2 wherein the applied energy includes chemical energy.

14. The method as defined in claim 2 wherein the application of energy to said layer of memory material is by scanning the layer and applying the energy in pulses at said selected desired portions.

15. The method as defined in claim 2 wherein the applied energy is beam energy.

16. The method as defined in claim 14 wherein the applied energy is beam energy.

17. The method as defined in claim 2 wherein the energy applied to said layer of memory material is applied in varying amounts to vary the degree to which said selected desired portions are physically changed and the values of the detectable characteristics thereof.

18. The method as defined in claim 1 including the further step of erasing the information recorded in the layer of memory material by applying energy to said layer to physically change the structural condition of said selected desired portions of the layer to substantially said one structural condition.

19. The method of recording information comprising the steps of: providing a layer of substantially disordered and generally amorphous memory material which has internal crystallizing forces and crystallizing inhibiting factors, which has one structural condition which is substantially disordered and generally amorphous and having one detectable characteristic, and which is capable of having portions thereof physically changed to another structural condition which is more ordered toward a crystalline like condition and having another detectable characteristic; providing said layer with a catalytic material which is catalytically capable of increasing the crystallizing forces and decreasing the crystallizing inhibiting factors of the memory material; and selectively, at selected desired portions of the layer of memory material in accordance with a desired pattern of useful information, activating the catalytic material at said selected desired portions of the layer and physically changing said layer at said selected desired portions from said one detectable structural condition which is substantially disordered and generally amorphous to said other detectable structural condition which is more ordered toward a crystalline like condition to record the desired pattern of useful information in said layer.

20. The method of recording information comprising the steps of: providing a layer of substantially disordered and generally amorphous memory material which includes a plurality of elements wherein at least one of said elements is polymer forming, which has one structural condition which is substantially disordered and generally amorphous and having one detectable characteristic, which is capable of having discrete portions thereof physically changed to another structural condition having another detectable characteristic, which has internal biasing forces toward said other structural condition, and which has internal inhibitions against the action of said biasing forces; providing said layer with a catalytic material which is catalytically capable of relatively increasing said biasing forces and decreasing said inhibitions against the action of said biasing forces of the memory material; and selectively, at selected desired portions of the layer of memory material in accordance with a desired pattern of useful information, activating the catalytic material at said selected desired discrete portions of the layer and physically changing said layer at said selected desired discrete portions from said one detectable structural condition which is substantially disordered and generally amorphous to said other detectable structural condition to record the desired pattern of useful information in said layer.

21. The method of recording information comprising the steps of: providing a layer of substantially disordered and generally amorphous memory material which has one structural condition which is substantially disordered and generally amorphous and having one detectable characteristic, which is capable of having discrete portions thereof physically changed to another structural condition having another detectable characteristic, which has internal biasing forces toward said other structural condition, and which has internal inhibitions against the action of said biasing forces; providing said layer with a catalytic material which is catalytically capable of relatively increasing said biasing forces and decreasing said inhibitions against the action of said biasing forces of the memory material; selectively, at selected desired portions of the layer of memory material in accordance with a desired pattern of useful information, applying visible light energy for activating the catalytic material at said selected desired portions of the layer to produce a latent image of activated catalytic material therein; and subsequently applying heat energy to said layer for physically changing said layer at said selected desired portions from said one detectable structural condition which is substantially disordered and generally amorphous to said other detectable structural condition to develop the latent image and record the desired pattern of useful information in said layer.

22. The method of recording information comprising the steps of: providing a layer of substantially disordered and generally amorphous material which has one structural condition which is substantially disordered and generally amorphous and having one detectable characteristic, which is capable of having discrete portions thereof physically changed to another structural condition having another detectable characteristic, which has internal biasing forces toward said other structural condition, and which has internal inhibitions against the action of said biasing forces; providing said layer with a catalytic material which is catalytically capable of relatively increasing said biasing forces and decreasing said inhibitions against the action of said biasing forces of the memory material; selectively, at selected desired portions of the layer of memory material in accordance with a desired pattern of useful information, applying energy for activating the catalytic material at said selected desired portions of the layer to produce a latent image of activated catalytic material therein; and subsequently applying further energy to said layer for physically changing said layer at said selected desired portions from said one detectable structural condition which is substantially disordered and generally amorphous to said other detectable structural condition to develop the latent image and record the desired pattern of useful information in said layer.

23. The method of recording information comprising the steps of: providing a layer of substantially disordered and generally amorphous memory material which has one structural condition which is substantially disordered and generally amorphous and having one detectable characteristic, which is capable of having discrete portions thereof physically changed to another structural condition having another detectable characteristic, which has internal biasing forces toward said other structural condition, and which has internal inhibitions against the action of said biasing forces; providing said layer with a catalytic material which is catalytically capable of relatively increasing said biasing forces and decreasing said inhibitions against the action of said biasing forces of the memory material; and selectively, at selected desired portions of the layer of memory material in accordance with a desired pattern of useful information, applying a short pulse of energy of less than 15 milliseconds duration for substantially simultaneously activating the catalytic material at said selected desired portions of the layer and physically changing said layer at said selected desired portions from said one detectable structural condition which is substantially disordered and generally amorphous to said other detectable structural condition to record the desired pattern of useful information in said layer.

24. The method of recording information as defined in claim 23 wherein said applied energy includes visible light.

25. The method of recording information as defined in claim 23 wherein said applied energy includes heat.

26. The method of recording information comprising the steps of: providing a layer of memory material having a structural condition which is substantially disordered and generally amorphous and having one detectable characteristic and which is capable of undergoing a physical change in structure to another structural condition having another detectable characteristic in response to the application of energy above a certain threshold, providing said layer with a catalytic material which is catalytically capable of changing said certain threshold so that said physical change in structure can occur in said memory material in response to the application of energy between said certain threshold and said changed threshold, selectively, at selected desired discrete portions of the layer of memory material in accordance with a desired pattern of useful information, activating the catalytic material at said selected desired discrete portions of the layer to change said certain threshlod value at said selected desired discrete portions, and applying energy of a value between said certain threshold and said changed threshold to said layer of memory material to cause a physical change in structure in said material from said one structural condition having said one detectable characteristic to said other structural condition having said other detectable characteristic in accordance with said pattern of useful information.

27. The method as defined in claim 26 wherein the catalytic material is catalytically capable of decreasing said certain threshold value so that said physical change in structure can occur in said memory material in response to the application of energy between said certain threshold and the lower threshold and the applied energy has a value below said certain threshold and above said lower threshold to cause the physical change in structure to occur at said selected desired discrete portions of said layer with no substantial physical change in structure occuring in portions of said layer other than said selected desired discrete portions of said layer.

28. The method of claim 26 wherein the catalytic material is catalytically capable of increasing said certain threshold value so that said physical change in structure can occur in said memory material in response to the application of energy between said certain threshold and the higher threshold, and the applied energy has a value above said certain threshold and below said higher threshold to cause the physical change in structure to occur at portions of said layer other than said selected desired discrete portions of said layer with no substantial physical change in structure occuring at said selected desired discrete portions of said layer.

29. The method of recording information comprising the steps of: providing a layer of substantially disordered and generally amorphous memory material which includes a plurality of elements wherein at least one of said elements is polymer forming, which has internal crystallizing forces and crystallizing inhibiting factors, which has one structural condition which is substantially disordered and generally amorphous and having one detectable characteristic, and which is capable of having portions thereof physically changed to another structural condition which is more ordered toward a crystalline like condition and having another detectable characteristic; providing said layer with a catalytic material which is catalytically capable of increasing the crystallizing forces and decreasing the crystallizing inhibiting factors of the memory material; and selectively, at selected desired portions of the layer of memory material in accordance with a desired pattern of useful information, activating the catalytic material at said selected desired portions of the layer and physically changing said layer at said selected desired portions from said one detectable structural condition which is substantially disordered and generally amorphous to said other detectable structural condition which is more ordered toward a crystalline like condition to record the desired pattern of useful information in said layer.

30. The method as defined in claim 29 wherein the step of activating the catalytic material and physically changing the structural condition of the layer of memory material at said selected desired portions includes applying energy to said layer.

31. The method as defined in claim 30 wherein the applied energy substantially simultaneously activates the catalytic material and physically changes the structural condition of the layer of memory material at said selected desired portions.

32. The method as defined in claim 30 wherein the energy is sequentially applied for first activating the catalytic material at said selected desired portions and then physically changing the structural condition of the layer of memory material at said selected desired portions where the catalytic material has been activated.

33. The method as defined in claim 30 wherein the application of energy to said layer of memory material includes directing a pattern image of electromagnetic energy including visible light thereon.

34. The method of recording information comprising the steps of: providing a layer of substantially disordered and generally amorphous memory material which has internal crystallizing forces and crystallizing inhibiting factors, which has one structural condition which is substantially disordered and generally amorphous and having one visually detectable characteristic, and which is capable of having portions thereof physically changed to another structural condition which is more ordered toward a crystalline like condition and having another visually detectable characteristic; providing said layer with a visible light disassociatable compound which, when disassociated by visible light, provides said layer with catalytic material which is catalytically capable of increasing the crystallizing forces and descreasing the crystallizing inhibiting factors of the memory material; and applying energy to said layer of memory material including directing visible light at desired portions of the layer in accordance with an image pattern to be recorded for disassociating said visible light disassociatable compound at said desired portions of the layer, activating the catalytic material disassociated from said compound at said desired portions of the layer, and physically changing said layer at said desired portions from said one visually detectable structural condition which is substantially disordered and generally amorphous to said other visually detectable structural condition which is more ordered toward a crystalline like condition to record visually said image pattern in said layer.

35. The method as defined in claim 34 wherein the energy applied to said layer also includes electrical energy.

36. The method as defined in claim 34 wherein the energy applied to said layer also includes heat.

37. The method as defined in claim 36 wherein the heat energy is applied later than the visible light.

38. The method of recording information comprising the steps of: providing a layer of substantially disordered and generally amorphous memory material of the polymeric type which includes a plurality of elements wherein at least one of said elements is polymer forming, which has one structural condition which is substantially disordered and generally amorphous having a relatively long chain or ring structure and having one detectable characteristic, which is capable of having portions thereof physically changed to another structural condition having a relatively short chain structure and having another detectable characteristic, which has internal biasing forces toward said other structural condition and which has internal inhibitions against the action of said biasing forces; providing said layer with a catalytic material which is catalytically capable of relatively increasing said biasing forces and decreasing said inhibitions against the action of said biasing forces of the memory material; and selectively, at seletcted desired portions of the layer of memory material in accordance with a desired pattern of useful information, activating the catalytic material at said selected desired portions of the layer and physically changing said layer at said selected desired portions from said one detectable structural condition which is substantially disordered and generally amorphous to said other detectable structural condition to record the desired pattern of useful information in said layer.

39. Apparatus for recording information comprising a layer of substantially disordered and generally amorphous memory material which has one structural condition which is substantially disordered and generally amorphous and having one detectable characteristic, which is capable of having discrete portions thereof physically changed to another structural condition having another detectable characteristic, which has internal biasing forces toward said other structural condition, and which has internal inhibitions against the action of said biasing forces, a catalytic material for said layer which is catalytically capable of increasing said biasing forces and decreasing said inhibitions against the action of said biasing forces of the memory material, means for selectively, at selected desired discrete portions of the layer of memory material in accordance with a desired pattern of useful information, activating the catalytic material at said selected desired discrete portions of the layer and physically changing said layer at said selected desired discrete portions from said one detectable structural condition which is substantially disordered and generally amorphous to said other detectable structural condition to record the desired pattern of useful information in said layer.

40. The apparatus as defined in claim 39 wherein said means for activating the catalytic material and physically changing the structural condition of the layer of memory material at said selected desired portions includes means for applying energy to said layer.

41. The apparatus as defined in claim 39 including means for applying energy to said layer of memory material to physically change the structural condition of said selected desired discrete portions of the layer to substantially said one structural condition for erasing the information recorded in said layer.

42. Apparatus for recording information comprising a layer of substantially disordered and generally amorphous memory material which includes a plurality of elements wherein at least one of said elements is polymer forming, which has internal crystallizing forces and crystallizing inhibiting factos, which is substantially disordered and generally amorphous and having one detectable characteristic, and which is capable of having portions thereof physically changed to another structural condition which is more ordered toward a crystalline like condition and having another detectable characterstic, a catalytic material for said layer which is catalytically capable of increasing the crystallizing forces and decreasing the crystallizing inhibiting factors of the memory material, means for selectively, at selected desired portions of the layer of memory material in accordance with a desired pattern of useful information, activating the catalytic material at said selected desired portions of the layer and physically changing said layer at said selected desired portions from said one detectable structural condition which is substantially disordered and generally amorphous to said other detectable structural condition which is more ordered toward a crystalline like condition to record the desired pattern of useful information in said layer.

43. The apparatus as defined in claim 42 wherein said means for activating the catalytic material and physically changing the structural condition of the layer of memory material at said selected desired portions includes means for applying energy to said layer.

44. The apparatus as defined in claim 42 including means for applying energy to said layer of memory material to physically change the structural condition of said selected desired portions of the layer to substantially said one structural condition for erasing the information recorded in said layer.

45. Apparatus for recording information comprising a layer of substantially disordered and generally amorphous memory material which has internal crystallizing forces and crystallizing inhibiting factors, which has one structural condition which is substantially disordered and generally amorphous and having one visually detectable characteristic, and which is capable of having portions thereof physically changed to another structural condition which is more ordered toward a crystalline like condition and having another visually detectable characteristic, a visible light disassociatable compound for said layer which, when disassociated by visible light, provides said layer with a catalytic material which is catalytically capable of increasing the crystallizing forces and decreasing the crystallizing inhibiting factors of the memory material, and means for applying energy to said layer of memory material including means for directing visible light at desired portions of the layer in accordance with an image pattern to be recorded for disassociating said visible light disassociatable compound at said desired portions of the layer, and physically changing said layer at said desired portions from said one visually detectable structural condition which is substantially disordered and generally amorphous to said other visually detectable structural condition which is more ordered toward a crystalline like condition to record visually said image pattern in said layer.

46. The method as defined in claim 19 wherein said other structural condition is a more ordered crystalline condition.

47. The method as defined in claim 29 wherein said other structural condition is a more ordered crystalline condition.

48. The method as defined in claim 34 wherein said other structural condition is a more ordered crystalline condition.

49. The apparatus as defined in claim 42 wherein said other structural condition is a more ordered crystalline condition.

50. The apparatus as defined in claim 45 wherein said other structural condition is a more ordered crystalline condition.

51. The method of recording information comprising the steps of: providing a layer of substantially disordered and generally amorphous memory material which has one structural condition which is substantially disordered and generally amorphous and having one detectable characteristic, which is capable of having discrete portions thereof physically changed to another structural condition having another detectable characteristic, which has internal biasing forces toward said other structural condition, which has internal inhibitions against the action of said biasing forces, and which has a selectively activatable catalytic effect which is catalytically capable of relatively increasing said biasing forces and decreasing said inhibitions against the action of said biasing forces of the memory material; and selectively, at selected desired discrete portions of the layer of memory material in accordance with a desired pattern of useful information, activating the selectively activatable catalytic effect at said selected desired discrete portions of the layer and physically changing said layer at said selected desired discrete portions from said one detectable structural condition which is substantially disordered and generally amorphous to said other detectable structural condition to record the desired pattern of useful information in said layer.

52. The method as defined in claim 51 wherein the step of activating the selectively activatable catalytic effect and physically changing the structural condition of the layer of memory material at said selected desired portions includes applying energy to said layer.

53. Apparatus for recording information comprising a layer of substantially disordered and generally amorphous memory material which has one structural condition which is substantially disordered and generally amorphous and having one detectable characteristic, which is capable of having discrete portions thereof physically changed to another structural condition having another detectable characteristic, which has internal biasing forces toward said other structural condition, which has internal inhibitions against the action of said biasing forces, and which has a selectively activatable catalytic effect which is catalytically capable of increasing said biasing forces and decreasing said inhibitions against the action of said biasing forces of the memory material, and means for selectively, at selected desired discrete portions of the layer of memory material in accordance with a desired pattern of useful information, activating the selectively activatable catalytic effect at said selected desired discrete portions of the layer and physically changing said layer at said selected desired discrete portions from said one detectable structural condition which is substantially disordered and generally amorphous to said other detectable structural condition to record the desired pattern of useful information in said layer.

54. The apparatus as defined in claim 53, wherein said means for activating the selectively activatable catalytic effect and physically changing the structural condition of the layer of memory material at said selected desired portions includes means for applying energy to said layer.

* * * * *